（12）United States Patent
Sugi

(10) Patent No.: US 9,788,464 B2
(45) Date of Patent: Oct. 10, 2017

(54) POWER SUPPLY DEVICE AND VACUUM PROCESSING APPARATUS USING THE SAME

(71) Applicant: CANON ANELVA CORPORATION, Asao-ku, Kawasaki-shi (JP)

(72) Inventor: Kyosuke Sugi, Fuchu (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 196 days.

(21) Appl. No.: 14/302,957

(22) Filed: Jun. 12, 2014

(65) Prior Publication Data

US 2014/0290862 A1    Oct. 2, 2014

Related U.S. Application Data

(63) Continuation of application No. PCT/JP2012/005570, filed on Sep. 3, 2012.

(30) Foreign Application Priority Data

Dec. 13, 2011    (JP) ................... 2011-272359

(51) Int. Cl.
    *C23C 16/00*    (2006.01)
    *C23C 16/50*    (2006.01)
    (Continued)

(52) U.S. Cl.
    CPC ...... *H05K 7/2089* (2013.01); *H01J 37/32715* (2013.01); *H01L 21/67109* (2013.01);
    (Continued)

(58) Field of Classification Search
    USPC ............. 118/728–733; 156/345.51–345.55
    See application file for complete search history.

(56) References Cited

U.S. PATENT DOCUMENTS 7,090,223 B2 *  8/2006  Reinhard .............. F16J 15/004
                                                277/551
8,182,660 B2    5/2012  Miura et al.
                        (Continued)

FOREIGN PATENT DOCUMENTS

CN    101192557 A    6/2008
JP    2006-179629 A  7/2006
                (Continued)

OTHER PUBLICATIONS

Office Action (Notification of the First Office Action) dated Nov. 3, 2015, by the State Intellectual Property Office of the People's Republic of China in corresponding Chinese Patent Application No. 201280061668.6, and an English Translation of the Office Action. (13 pages).

(Continued)

*Primary Examiner* — Karla Moore
*Assistant Examiner* — Tiffany Nuckols
(74) *Attorney, Agent, or Firm* — Buchanan Ingersoll & Rooney PC

(57) ABSTRACT

A power supply device supplies power to a substrate holder having a plurality of electrodes. The device includes a first fixed conductive member, a second fixed conductive member, a fixed insulating member fixed to an insulating housing portion and configured to insulate the first fixed conductive member from the second fixed conductive member, a first rotation conductive member, a second rotation conductive member, a rotation insulating member fixed to an insulating column portion and configured to insulate the first rotation conductive member from the second rotation conductive member, a first power supply member configured to supply a first voltage to the substrate holder via the first rotation conductive member and the first fixed conductive member, and a second power supply member configured to supply a (Continued)

second voltage to the substrate holder via the second rotation conductive member and the second fixed conductive member.

12 Claims, 10 Drawing Sheets

(51) Int. Cl.
    *C23F 1/00* (2006.01)
    *H01L 21/306* (2006.01)
    *H05K 7/20* (2006.01)
    *H01L 21/687* (2006.01)
    *H01L 21/683* (2006.01)
    *H01J 37/32* (2006.01)
    *H01L 21/67* (2006.01)

(52) U.S. Cl.
    CPC ...... *H01L 21/6831* (2013.01); *H01L 21/6833* (2013.01); *H01L 21/68764* (2013.01); *H01L 21/68792* (2013.01); *H05K 7/20009* (2013.01)

(56) References Cited

U.S. PATENT DOCUMENTS 8,999,121 B2    4/2015    Sugi et al.
2008/0258411 A1*  10/2008  Miura .................. C23C 14/505
                                                    279/128
2011/0272278 A1    11/2011  Sugi et al.

FOREIGN PATENT DOCUMENTS

JP        2007-019067 A    1/2007
JP        2008-156746 A    7/2008
WO     WO 2010/073330 A1    7/2010
WO     WO 2012/011149 A1    1/2012

OTHER PUBLICATIONS

Notice of Allowance issued in corresponding Korean Patent Application No. 10-2014-7019003, dated Mar. 28, 2016. (2 pages).

International Search Report (PCT/ISA/210) dated Nov. 20, 2012, by the Japanese Patent Office as the International Searching Authority for International Application No. PCT/JP2012/005570.

Written Opinion (PCT/ISA/237) dated Nov. 20, 2012, by the Japanese Patent Office as the International Searching Authority for International Application No. PCT/JP2012/005570.

\* cited by examiner

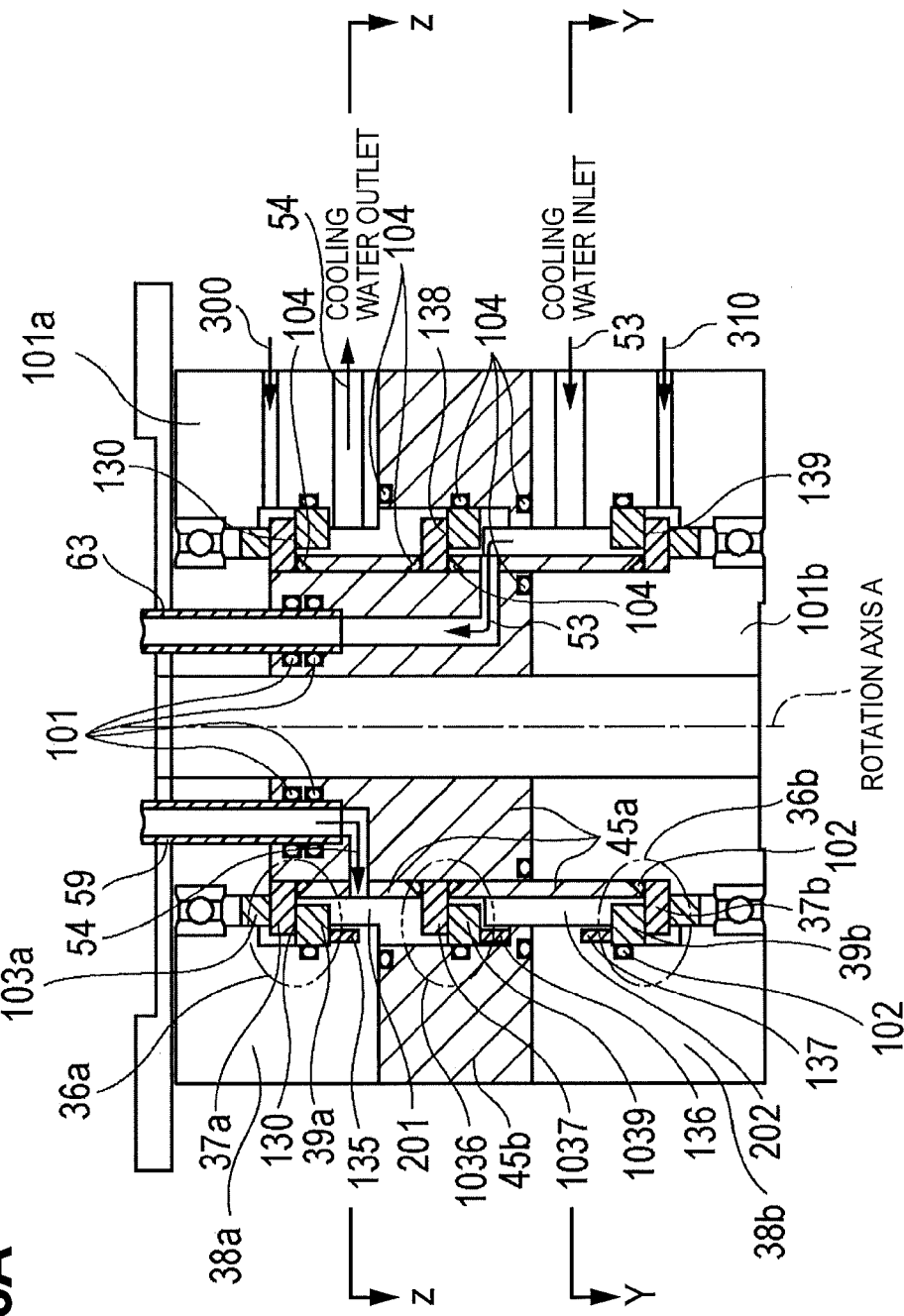

PRIOR ART

F I G. 7B
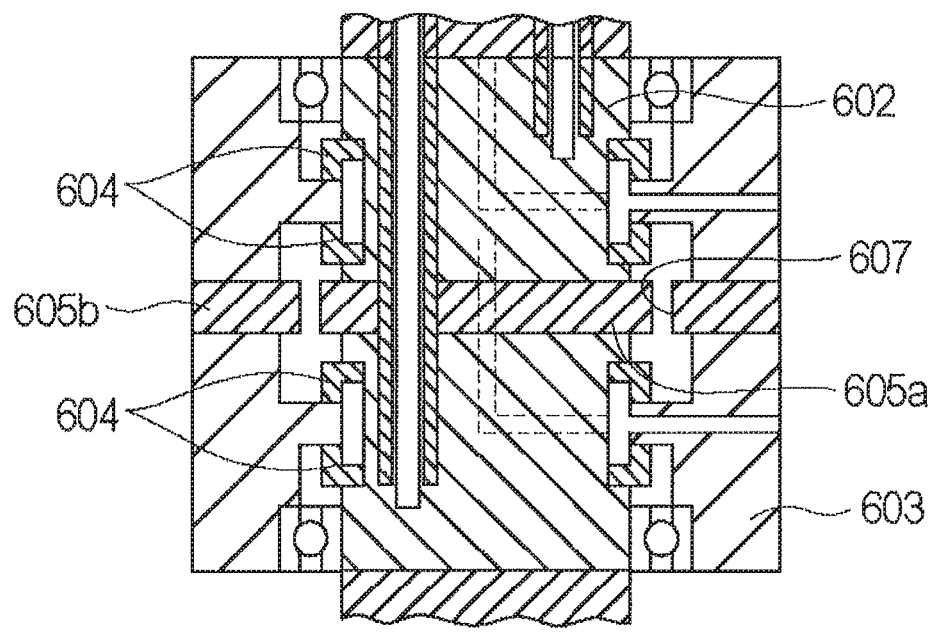
PRIOR ART

POWER SUPPLY DEVICE AND VACUUM PROCESSING APPARATUS USING THE SAME

This application is a continuation of International Patent Application No. PCT/JP2012/005570 filed on Sep. 3, 2012, and claims priority to Japanese Patent Application No. 2011-272359 filed on Dec. 13, 2011, the entire content of both of which is incorporated herein by reference.

TECHNICAL FIELD

The present invention relates to a power supply device and a vacuum processing apparatus using the same. More particularly, the present invention relates to a power supply device suitable for supplying power to the electrostatic chuck of a substrate holder arranged rotatably in a vacuum processing chamber and a vacuum processing apparatus using the power supply device.

BACKGROUND ART

A conventional power supply device will be described below with reference to FIGS. 7A and 7B. In the arrangement disclosed in PTL 1, for example, as shown in FIG. 7A, a substrate holder 601 of a power supply device is held to be rotatable inside a vacuum vessel 630. The substrate holder 601 has a slidable surface using surface contact about a rotation axis C of a rotation column 602 as its center between the rotation column 602 and a base 603 which supports the load of the rotation column of the substrate holder 601. A rotary joint made of a plurality of conductive annular members 604 arranged concentrically is arranged to make it possible to stably supply the power to the electrode of the electrostatic chuck without causing unstable rotation of the substrate holder 601. As for a bipolar electrostatic chuck for supplying power to a plurality of electrodes, a plurality of rotary joints are aligned in the rotation axis direction to sandwich insulating members 605a and 605b between the adjacent rotary joints, thereby maintaining the insulating state between the plurality of electrodes.

To obtain a stable rotation operation in this structure, the insulating members 605a and 605b are arranged on the side of the rotation column 602 of the substrate holder 601 and on the side of the base 603 which supports the load of the rotation column and the like. A minimum gap 607 must be formed between the insulating members. The rotary joint has an incomplete sealing property, and a very small amount of liquid may leak from the rotary joint. A drain port is generally formed to drain the leaking liquid outside

CITATION LIST

Patent Literature

PTL 1: Japanese Patent Laid-Open No. 2008-156746

SUMMARY OF INVENTION

Technical Problem

However, in addition to the substrate holder by which a substrate is held horizontally with respect to the ground, as shown in FIG. 7A, there have recently increased substrate processing apparatuses each capable of turning a substrate holder in a state in which the normal to the substrate holding surface of the substrate holder is perpendicular to the gravity direction for a larger substrate and space saving of the substrate processing apparatus. In such a substrate processing apparatus, it is often difficult to drain, from the drain port, the liquid leaking from the rotary joint.

For example, even if the resistivity of pure water flowing through the internal channel is managed to be 10 MΩ·cm or more, the resistivity of the pure water leaking from the rotary joint drops soon. This results in the presence of the liquid having a low resistivity between the plurality of electrodes. In some cases, the plurality of electrodes can electrically be connected through this liquid.

The present invention has been made in consideration of the above problem, and has as its object to provide a power supply device usable in a processing apparatus which turns a substrate holder in a state in which the normal to the substrate holding surface of a substrate holder is perpendicular to the gravity direction.

Solution to Problem

In order to achieve the above object according to the present invention, there is provided a power supply device comprising a substrate holder capable of holding a substrate, a column connected to the substrate holder and including a first conductive column portion and a second conductive column portion, a housing rotatably supporting the column and including a first conductive housing portion and a second conductive housing portion, a first conductive portion configured to supply a first voltage from the first conductive housing portion to the first conductive column portion, a second conductive portion configured to supply a second voltage from the second conductive housing portion to the second conductive column portion, the second conductive portion being insulated from the first conductive portion, a first power supply member connected to the first conductive column portion and configured to supply the first voltage to the substrate holder, and a second power supply member connected to the second conductive column portion and configured to supply the second voltage to the substrate holder, wherein a first space in contact with the first conductive portion and capable of flowing a coolant and a second space in contact with the second conducive portion and capable of flowing the coolant are formed in a gap between the column and the housing, and the power supply device further comprises separating means for separating the first space from a member applied with the second voltage and separating the second space from a member applied with the first voltage.

Advantageous Effects of Invention

The present invention can be applied to a substrate processing apparatus in which the substrate holder is turned in a state in which the normal to the substrate holding surface of the substrate holder is perpendicular to the gravity direction, thereby stably supplying power to the substrate holder having a plurality of electrodes.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 3A is a view for explaining a fluid channel for circulating a coolant;

FIG. 7B is a view for explaining the conventional power supply device.

DESCRIPTION OF EMBODIMENTS

Figure 1:
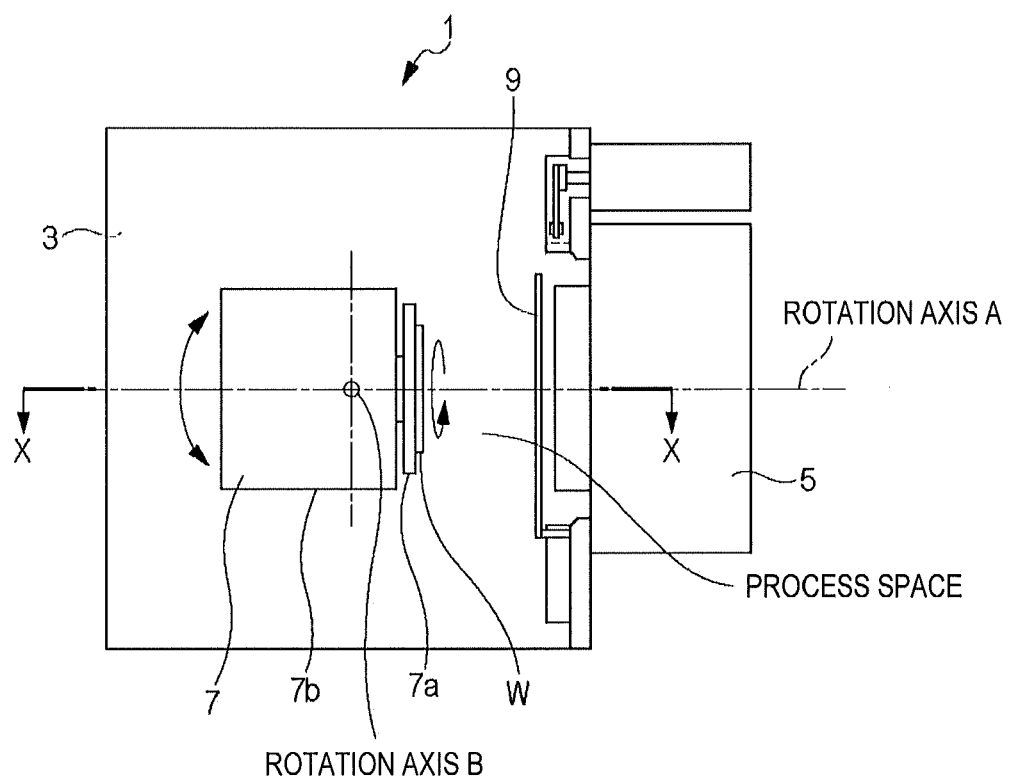
FIG. 1 is a schematic sectional view of an ion beam etching apparatus having a power supply device according to the first embodiment of the present invention when viewed from its side surface.

The embodiments of the present invention will be described below with reference to the accompanying drawings. Note that members and layouts to be described below are merely examples, and will not limit the present invention. Various modifications can be made within the scope of the present invention, as a matter of course. Note that the same reference numerals throughout the accompanying drawings to be described below denote the same functions, and a repetitive explanation will be omitted.

This embodiment will exemplify an ion beam etching apparatus as a vacuum processing apparatus, but the scope of the present invention is not limited to this example. For example, a power supply device according to the present invention is applicable to a vacuum processing apparatus such as another etching apparatus, sputtering deposition apparatus, PVD apparatus, or CVD apparatus.

First Embodiment

Figure 2:
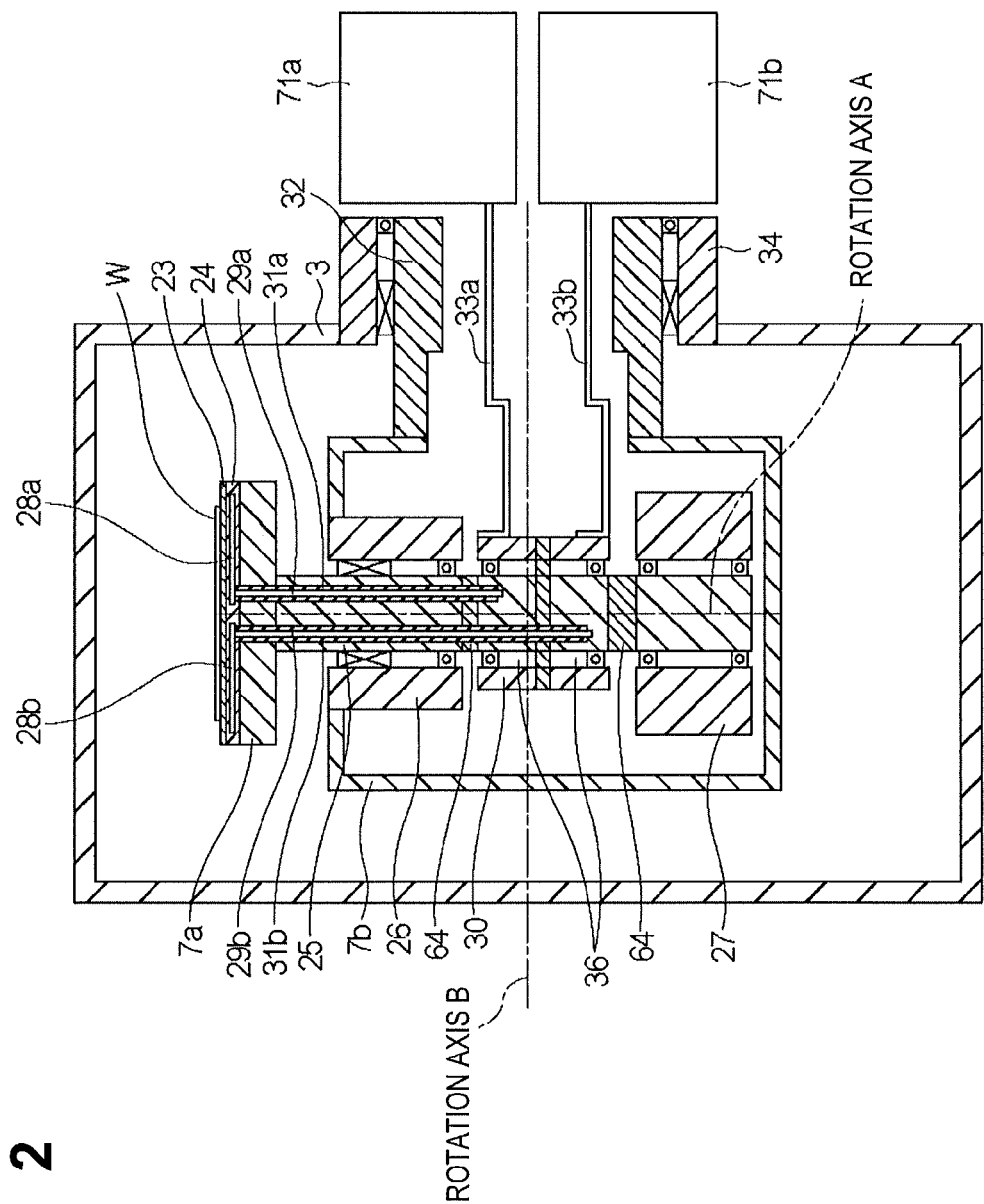
FIG. 2 is a sectional view when viewed from a line X-X in FIG. 1.
Figure 3B:
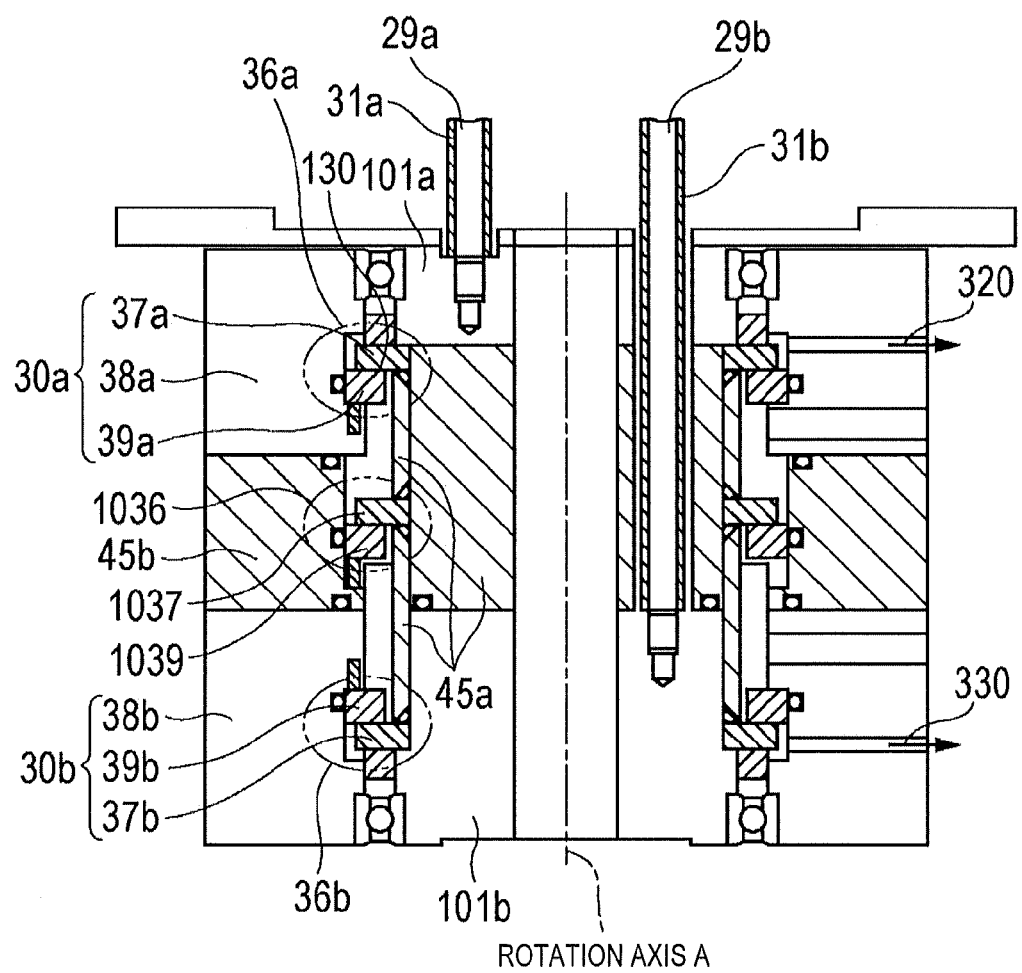
FIG. 3B is a view showing the details of a power supply mechanism shown in FIG. 2.

FIG. 1 is a schematic sectional view of an ion beam etching apparatus having a power supply device when viewed from the side surface according to the present invention. FIG. 2 is a sectional view along a line X-X of FIG. 1. FIGS. 3A and 3B are views showing the details of a power supply mechanism 30 (power supply device) shown in FIG. 2. Note that some members are not illustrated to prevent complication of the accompanying drawings. An ion beam etching apparatus 1 is an apparatus for irradiating a substrate W placed on a substrate stage 7 with ions emitted by an ion beam source 5 and etching a stacked film formed on the substrate W.

The ion beam etching apparatus shown in FIG. 1 includes, in a vacuum vessel 3 (vacuum processing chamber), the ion beam source 5 serving as an etching source, the substrate stage 7, and a shutter device 9. The ion beam source 5 is arranged on the side surface of the vacuum vessel 3. The substrate stage 7 is arranged to oppose the ion beam source 5.

The substrate stage 7 includes, as constituent components, a substrate holder (to be referred to as a substrate holding portion 7a hereinafter) for holding the substrate W and a housing (to be referred to as a rotation support portion 7b) for supporting the substrate holding portion 7a. The rotation support portion 7b is supported by the vacuum vessel 3. The substrate holding portion 7a can attract and hold the substrate W by an electrostatic chuck mechanism. The substrate holding portion 7a can rotate together with the substrate W. The rotation support portion 7b is pivotal about a rotation axis B (first rotation axis) as the rotation center. The rotation support portion 7b can change the direction of the substrate holding portion 7a opposing the ion irradiation surface of the ion beam source 5. That is, the angle of the substrate etching surface with respect to the incident direction of ions emitted by the ion beam source 5 can be changed. By changing the incident angle of the ions on the substrate etching surface, the ions can enter the etching surface of the substrate W from an oblique direction, thereby performing accurate etching.

The ion beam source 5 is a unit for irradiating the substrate W with ions obtained by ionizing a gas with a plasma. In this embodiment, Ar gas is ionized. However, ions to be radiated are not limited to Ar ions. For example, a Kr gas, Xe gas, $O_2$ gas, or the like can be used. A neutralizer (not shown) for neutralizing charges of the ions emitted by the ion beam source 5 is arranged on the side wall surface of the ion beam source 5.

The shutter device 9 is arranged between the ion beam source 5 and the substrate W on the substrate stage 7. The opening/closing operation of the shutter device 9 can block the ions emitted by the ion beam source 5 to the substrate W before the ions reach the substrate W.

The interior of the substrate stage 7 will now be described with reference to FIG. 2. The rotation support portion 7b is a stage rotatable about the rotation axis B (first rotation axis). The substrate holding portion 7a is a substrate support table having an electrostatic attraction mechanism rotatable about a rotation axis A (second rotation axis) in a direction perpendicular to the rotation axis B (first rotation axis). The substrate can be placed on the substrate holding portion 7a by the attraction operation of the electrostatic attraction mechanism. The rotation support portion 7b is arranged in the vacuum vessel 3, and the substrate holding portion 7a is coupled to one end of the rotation support portion 7b. A rotation column 25 (column) is coupled to the lower surface (that is, a surface opposite to the surface on which the substrate is held) of the substrate holding portion 7a. The rotation column 25 made of a conductive material is rotatably mounted, through a vacuum seal mechanism 26 such as a magnetic fluid seal, in a hole portion formed in one end of the rotation support portion 7b. This makes it possible to maintain the interior of the vacuum vessel 3 in a hermetic state. The substrate holding portion 7a fixed to the rotation column 25 rotates together with the substrate W held by the substrate holding portion 7a by a rotation mechanism (rotation driving device 27). The power supply mechanism 30 includes a first rotation driving device for rotating the rotation support portion 7b about the rotation axis B (first rotation axis) and a second rotation driving device for rotating the substrate holding portion 7a about the rotation axis A (second rotation axis) in a direction perpendicular to the rotation axis B (first rotation axis).

For example, the rotation driving device 27 is arranged on a side opposite to the substrate holding portion 7a when viewed from the vacuum seal mechanism 26. The rotation driving device 27 functions as a motor for rotating the rotation column 25 by the interaction between a magnet (not shown) attached to the rotation column 25 and an electromagnet (not shown) arranged around the magnet. An encoder (not shown) for detecting the rotation speed and rotation direction of the rotation column 25 is added to the rotation driving device 27.

The substrate holding portion 7a includes a dielectric plate 23 having a holding surface for holding the substrate W and an electrostatic chuck (electrostatic attraction device) 24 for attracting the substrate W with an electrostatic attraction force to the dielectric plate 23 and fixing it to the dielectric plate 23. In addition, a fluid channel (not shown) for supplying a heat conduction lower surface gas to the lower surface side of the substrate W fixed on the dielectric plate 23 by the electrostatic chuck 24 is formed in the substrate holding portion 7a. A supply port communicating with the fluid channel is formed in the vacuum seal mechanism 26. The lower surface gas is a gas by which heat is efficiently conducted from the substrate W to the substrate holding portion 7a cooled by a coolant. Conventionally, argon gas (Ar) or nitrogen gas is used. Note that cooling water for cooling the lower surface side of the substrate W is supplied to the substrate holding portion 7a through a cooling water supply pipe 63 shown in FIGS. 4A, 4B and 5 (to be described later), and drained through a cooling water drain pipe 59.

The electrostatic chuck 24 is a positive and negative, bipolar chuck device and includes two electrodes 28a and 28b. The electrode 28a of one polarity and the electrode 28b of the other polarity are embedded in plate-like insulating members, respectively. A predetermined first voltage is supplied to the electrode 28a via a power supply rod 29a (first power supply member) arranged inside the substrate holding portion 7a and the rotation column 25. A predetermined second voltage is supplied to the electrode 28b via a power supply rod 29b (second power supply member) arranged inside the substrate holding portion 7a and the rotation column 25. The two power supply rods 29a and 29b extend to the lower portion of the rotation column 25, as shown in FIG. 2. The power supply rods 29a and 29b are covered with insulating members 31a and 31b, respectively.

The power supply mechanism 30 (power supply device) is arranged midway along the rotation column 25 to supply different voltages (for example, two different bias voltages) for electrostatic attraction from an external power supply to the two electrodes 28a and 28b of the electrostatic chuck 24. In order to prevent a state in which the power supply mechanism 30 is electrically connected to the vacuum seal mechanism 26 and the rotation driving device 27 through the rotation column 25, insulating members 64 are arranged at one end and the other end, respectively, of a portion of the rotation column 25 extending through the power supply mechanism 30. The power supply mechanism 30 and a first voltage power supply 71a for supplying the first voltage (for example, a DC bias voltage or RF voltage) are connected to an insulated cable 33a (first voltage supply line). The power supply mechanism 30 and a second voltage power supply 71b for supplying a second voltage (for example, a DC bias voltage or RF voltage) are connected to an insulated cable 33b (second voltage supply line). These cables 33a and 33b are connected in a loose state so as not to be disconnected even if the unit is rotated and twisted about the rotation axis B. A rotary joint 36 is arranged in the power supply mechanism 30. The details of the rotary joint 36 will be described later.

A rotation cylinder 32 is rotatable about the rotation axis B. The rotation support portion 7b is fixed to the rotation cylinder 32. The rotation cylinder 32 is rotatably mounted, through a vacuum seal mechanism 34 such as a magnetic fluid seal, in a hole portion formed in the vacuum vessel 3. This makes it possible to maintain the interior of the vacuum vessel 3 in a hermetic state. For example, a servo motor (not shown) can rotate the rotation cylinder 32.

The power supply mechanism 30 of the rotary joint 36 (36a and 36b) will be described in detail with reference to FIGS. 3A and 3B. The rotary joint 36a (first conductive portion) includes a conductive annular member 37a (first rotation conductive member) and a conductive annular member 39a (first fixed conductive member). The conductive annular member 37a is fixed to a rotation column 101a (first conductive column portion) made of a conductive material and fixed to the rotation column 25. The conductive annular member 37a is arranged so that its center matches the center of the rotation axis A. The conductive annular member 39a is fixed to a housing 38a (first conductive housing portion) made of a conductive material. The conductive annular member 39a is arranged so that its center matches the center of the rotation axis A. The housing 38a is an annular member so that its center matches the center of the rotation axis A.

The conductive annular members 37a and 39a are arranged in slidable surface contact with an annular portion 130. The conductive annular member 39a is biased against the conductive annular member 37a by an elastic member 135 (for example, a leaf spring, coil spring, or rubber member). The elastic member 135 functions as an auxiliary mechanism for holding the hermetic state (seal property) of the sliding annular portion 130. When the rotation column 25 rotates, the conductive annular member 37a and the conductive annular member 39a are in slidable contact at the rotary joint 36a. The housing 38a is fixed to the rotation support portion 7b and connected to the first voltage power supply 71a via the conductive cable 33a the surface of which is covered with an insulating film material.

Similarly, the rotary joint 36b (second conductive portion) includes a conductive annular member 37b (second rotation conductive member) and a conductive annular member 39b (second fixed conductive member). The conductive annular member 37b is fixed to a rotation column 101b (second conductive support portion) made of a conductive material and fixed to the rotation column 25. The conductive annular member 37b is arranged so that its center matches the center of the rotation axis A. The conductive annular member 39b is fixed at a position spaced apart from a position where the conductive annular member 39a (first fixed conductive member) in the housing 38a is fixed. The conductive annular member 39b is arranged so that its center matches the center of the rotation axis A. The conductive annular members 37b and 39b are arranged in slidable surface contact with an annular portion 139. The conductive annular member 39b is biased against the conductive annular member 37b by an elastic member 137 (for example, a leaf spring, coil spring, or rubber member). The elastic member 137 functions as an auxiliary mechanism for holding the hermetic state (seal property) of the sliding annular portion 139.

A rotary joint 1036 (insulating seal portion) includes an annular member 1037 (rotation insulating member) and an annular member 1039 (fixed insulating member). The annular members 1037 and 1039 are members having, for example, a resistivity of 1 MΩ·cm or more. In this embodiment, in consideration of the seal performance, silicon carbide having a high wear resistance is used as the annular members 1037 and 1039. The annular member 1037 is fixed around a rotation column 45a (insulating column portion) made of an insulating material and fixed to the rotation column 25. The annular member 1037 is arranged at a position on a concentric circle using the rotation axis A as the center. The annular member 1037 is arranged at a position spaced apart from the rotation columns 101a and 101b and set in an electrically floating state. The annular member 1039 is fixed to a housing 45b (insulating housing portion) made of an insulating material and arranged concentrically with the rotation column 45a using the rotation axis A as the center. The annular member 1039 is arranged at a position spaced apart from the housing 38a and a housing 38b and set in an electrically floating state. The annular members 1037 and 1039 are arranged in slidable surface contact with an annular portion 138. The annular member 1039 is biased against the annular member 1037 by an elastic member 136. The elastic member 136 functions as an auxiliary mechanism for holding the hermetic property (seal property) of the sliding annular portion 138.

When the rotation column 25 rotates, the conductive annular member 37b and the conductive annular member 39b slide with the rotary joint 36b. The housing 38b is fixed to the rotation support portion 7b and connected to the second voltage power supply 71b via the conductive cable 33b the surface of which is covered with an insulating film. When the rotation column 25 rotates, the annular members 1037 and 1039 slide with the rotary joint 1036.

The power supply mechanism 30 can apply a DC bias power to the electrostatic chuck 24. The power supply mechanism 30 is electrically divided into two zones by the first insulating member 45a (rotation insulating member) sandwiched between the rotation columns 101a and 101b and the second insulating member 45b (fixed insulating member) sandwiched between the housings 38a and 38. The two divided zones are arranged in series using the rotation axis B as the center through the first insulating member 45a and the second insulating member 45b.

One of the two electrodes of the electrostatic chuck 24 is electrically connected to one of the regions of the power supply mechanism 30 divided by the first insulating member 45a and the second insulating member 45b. The other of the two electrodes of the electrostatic chuck 24 is electrically connected to the other of the divided regions. The power supply mechanism 30 is divided by the first insulating member 45a and the second insulating member 45b into a divided region 30a closer to the electrostatic chuck 24 and a divided region 30b far from the electrostatic chuck 24. The divided regions 30a and 30b are insulated from each other. The electrode 28a of the electrostatic chuck 24 and the divided region 30a are electrically connected via the power supply rod 29a which is formed in the rotation column 25 made of a conductive material and is covered with the insulating member 31a.

The electrode 28 of the electrostatic chuck 24 and the divided region 30b are electrically connected via the power supply rod 29b formed in the rotation column 25 and covered with the insulating member 31b. The power supply rod 29b is covered with the insulating member 31b in the divided region 30b.

The power supply mechanism 30 includes the rotation columns 101a and 101b and the housings 38a and 38b arranged around the rotation columns 101a and 101b. The power supply mechanism 30 includes the first and second insulating members 45a and 45b which divide the power supply mechanism 30 into the divided regions 30a and 30b. The power supply mechanism 30 further includes the rotary joints 36a and 36b made of a conductive material and serving to slide the rotation columns 101a and 101b and the housings 38a and 38b. The rotation column 101a (first conductive column portion), the first insulating member 45a (insulating column portion), and the rotation column 101b (second conductive column portion) shown in FIG. 3B are integrated to form the rotation column 25 (FIG. 2). The housings 38a and 38b (first and second conductive housing portions) and the second insulating member 45b (insulating housing portion) shown in FIG. 3B are integrated to form the housing 38 (FIG. 2).

The power supply rod 29a electrically connects the electrode 28a and the divided region 30a corresponding to the electrode 28a while a region extending from the electrode 28a of the electrostatic chuck 24 to the divided region 30a corresponding to the power supply mechanism 30 is kept insulated. The power supply rod 29b electrically connects the electrode 28b and the divided region 30b corresponding to the electrode 28b while a region extending from the electrode 28b of the electrostatic chuck 24 to the divided region 30b corresponding to the power supply mechanism 30 is kept insulated.

The divided region 30a is electrically connected to the conductive housing 38a through the conductive rotary joint 36a. The housing 38a is electrically connected to the first voltage power supply 71a. The first voltage is applied from the first power supply 71a to the housing 38a. The divided region 30b is electrically connected to the conductive housing 38b through the conductive rotary joint 36b. The housing 38b is electrically connected to the second voltage power supply 71b. The second voltage is applied from the second voltage power supply 71b to the housing 38b.

According to this embodiment, an electrical path for supplying power to the electrostatic chuck 24 can be included in the rotation column 25. Without routing electrical wires and the like, the power supply path to the electrostatic chuck can be ensured. In addition, since the electrical path can be included in the rotation column 25, the cables of the electrical circuits are not entangled even if the substrate holding portion 7a is rotated.

In this embodiment, the power supply mechanism 30 is divided into two divided regions 30a and 30b insulated from each other. The electrode 28a and the divided region 30a are electrically connected while a region extending from the electrode 28a to the divided region 30a is kept insulated. The electrode 28b and the divided region 30b are electrically connected while a region extending from the electrode 28b to the divided region 30b is kept insulated. With this structure, power can be properly supplied from each power supply to the electrostatic chuck 24 without shorting the positive and negative voltages supplied to the electrostatic chuck 24.

Figure 4A:
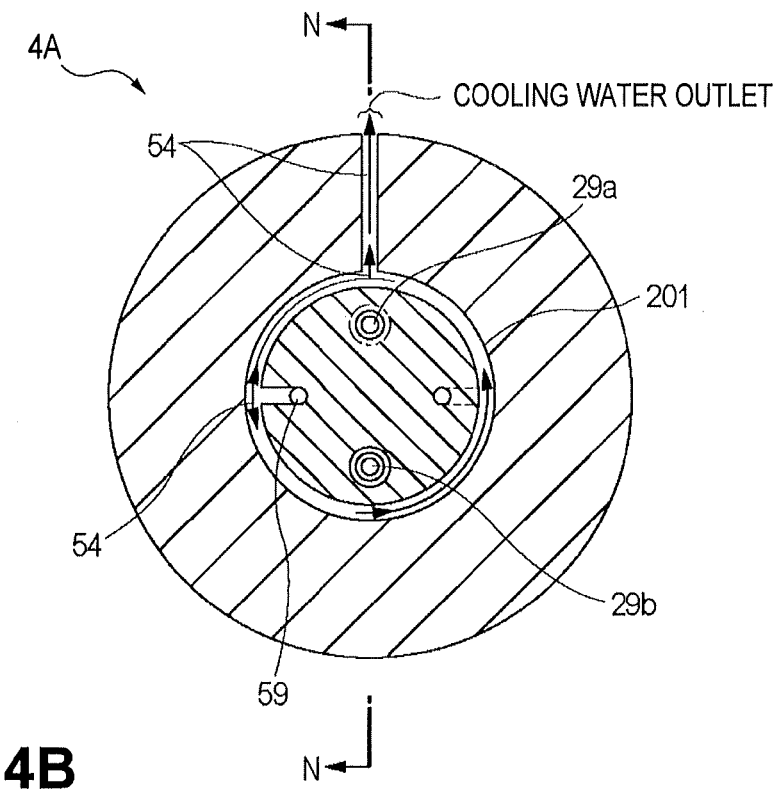
FIG. 4A is a view showing the section along a line Z-Z of FIG. 3A.
Figure 4B:
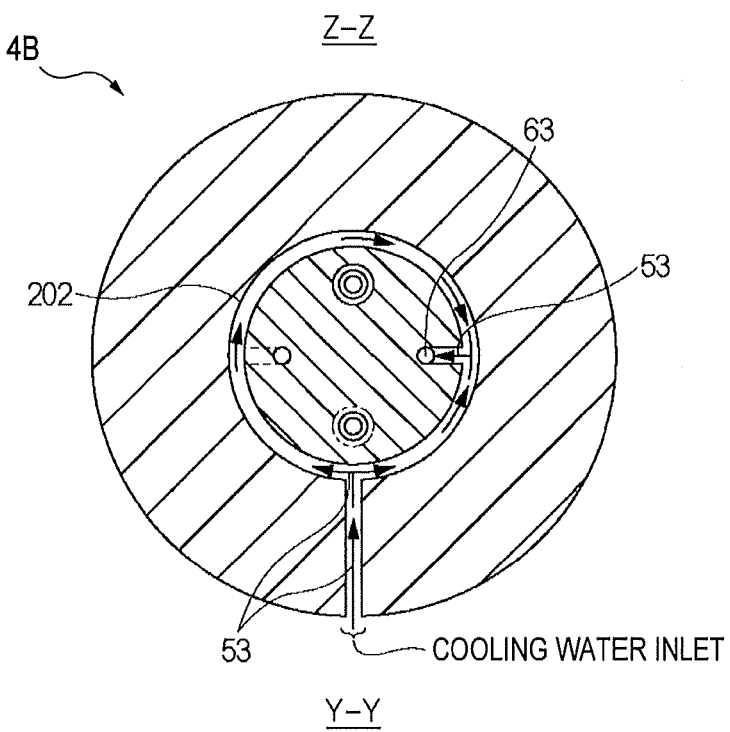
FIG. 4B is a view showing the section along a line Y-Y of FIG. 3A.

A fluid channel for circulating a coolant for cooling the substrate holding portion 7a will be described with reference to FIGS. 3A, 4A, and 4B. FIG. 3A is a view showing another section of the power supply mechanism 30 described with reference to FIG. 3B. FIG. 4A is a view showing the section along a line Z-Z of FIG. 3A. FIG. 4B is a view showing the section along a line Y-Y of FIG. 3A.

A coolant supply mechanism (not shown) circulates, as a coolant, pure water (cooling water) managed to have a resistivity of 1 MΩ·cm or more. The cooling water flows in from the cooling water inlet shown in FIG. 4B and flows in a channel (first channel) as indicated by an arrow 53. The pure water (cooling water) is supplied from the cooling water supply pipe 63 to the substrate holding portion 7a through a through hole (not shown) extending through in the rotation column 25 in FIG. 2. Note that the cooling water supply pipe 63 is a pipe-like insulating member communicating with a portion extending from the first insulating member 45a (rotation insulating member) to the substrate holding portion 7a (substrate holder). O-rings 101 made of an elastomer material seal the pipe-like cooling water supply pipe 63 appropriately in the first insulating member 45a.

The pure water (cooling water) supplied to the substrate holding portion 7a through the cooling water inlet, the cooling water supply pipe 63, and the through hole in the rotation column 25 flows in a cooling water circulation channel (not shown) formed inside the substrate holding portion 7a. The pure water (cooling pipe) flows into the cooling water drain, pipe 59 shown in FIG. 4A through a through hole (not shown) in the rotation column 25. The pure water is then drained from the cooling water outlet. The cooling water drain pipe 59 is a pipe-like insulating member which communicates with a region from the substrate holding portion 7a to the first insulating member 45a (rotation insulating member). O-rings 101 made of an elastomer material seal the pipe-like cooling water drain pipe 59 appropriately in the first insulating member 45a. The pure water (cooling water) from the substrate holding portion 7a flows in a channel (second channel) as indicated by an arrow 54 in FIG. 4A. The pure water (cooling water) then returns from the cooling water outlet to a coolant supply mechanism (not shown) by a pipe member (not shown) and drains outside the power supply mechanism. This structure can make it possible to prevent the cooling water from leaking inside the divided regions 30a and 30b when the coolant (cooling water) flows in the channel. As shown in the rotary joint 36b of FIG. 3A, an O-ring 102 is arranged to seal between members to prevent leakage of the cooling water from the channel, thereby preventing cooling water leakage from the channel. An O-ring 104 is arranged to achieve the same purpose as described above.

A rubber seal member 103a such as an oil seal is arranged ahead of the sliding portion between the conductive annular members 37a and 39a in slidable contact to prevent leakage of cooling water (coolant) in a small amount at the sliding portion. In order to dry leaking cooling water (coolant), a gas supply mechanism (not shown) supplies a drying gas from a drying air inlet port 300 (FIG. 3A) and exhausts the gas from a drying air outlet 320 (FIG. 3B) toward a gas collection mechanism (not shown), thereby collecting the gas. A gas channel (third channel) communicating with the drying air inlet port 300 supplies the gas from a gas supply mechanism (now shown) outside the conductive annular members 37a and 39a to the interior of a space 201. The gas supplied from the gas channel (third channel) is exhausted toward the gas collection mechanism (not shown) through a gas channel (fourth channel) communicating with the drying air outlet 320.

A drying air inlet port 310 (FIG. 3A) and a drying air outlet 330 (FIG. 3B) are formed in a space formed by the conductive annular member 37b, the conductive annular member 39b, and a rubber seal member 103b. A gas channel (fifth channel) communicating with the drying air inlet port 310 supplies the gas from a gas supply mechanism (not shown) outside the conductive annular members 37b and 39b to the interior of a space 202. The gas supplied from the gas channel (fifth channel) is exhausted toward a gas collection mechanism (not shown) through a gas channel (sixth channel) communicating with the drying air outlet 330. The drying gas from the drying air inlet ports 300 and 310 is supplied to dry the leaking coolant (cooling water) of the cooling water (coolant) stopped by the sliding portion.

Referring to FIG. 3A, the space 201 (first space) is a space formed in a gap between the rotation column 25 and the housing 38a to flow the coolant to be drained. More specifically, the space 201 is formed by the outer surface of the rotation column 101a, the inner surface of the housing 38a which faces the outer surface of the rotation column 101a, the conductive annular member 37a, the annular member 1037, the conductive annular member 39a, the annular member 1039, the first insulating member 45a, and second insulating member 45b. The interior of the space 201 (coolant drain space) is kept in a hermetic state. The space 201 (first space) is formed to be spaced apart from the outer surface of the rotation column 101b, the inner surface of the housing 38b, the conductive annular member 37b, and the conductive annular member 39b. For this reason, the coolant in the space 201 does not contact a member applied with a voltage different from the voltage (first voltage) applied to the housing 38a and the like. The space 201 forms a channel for flowing out the coolant (cooling water) from the cooling water drain pipe 59 shown in FIG. 4A to the cooling water outlet.

The space 202 (second space) is a space formed in a gap between the rotation column 25 and the housing 38b to flow the supplied coolant. More specifically, the space 202 is formed by the outer surface of the rotation column 101b, the inner surface of the housing 38b which faces the outer surface of the rotation column 101b, the conductive annular member 37b, the annular member 1037, the conductive annular member 39b, and the annular member 1039. The interior of the space 202 is held in a hermetic state. The space 202 (second space) is formed to be spaced apart from the outer surface of the rotation column 101a, the inner surface of the housing 38a, the conductive annular member 37a, and the conductive annular member 39a. For this reason, the coolant in the space 202 does not contact a member applied with a voltage different from the voltage (second voltage) applied to the housing 38b and the like. The space 202 forms a channel for flowing the coolant (cooling water) from the cooling water inlet shown in FIG. 4B to the cooling water supply pipe 63.

When the coolant (cooling water) is circulated in the spaces 201 and 202 formed by the rotary joints 36a, 36b, and 1036, this results in dissipating heat generated by the respective rotary joints 36a, 36b, and 1036. The sliding property between the sliding annular members can also be improved, thereby greatly prolonging the lifetime of each annular member.

Figure 5:
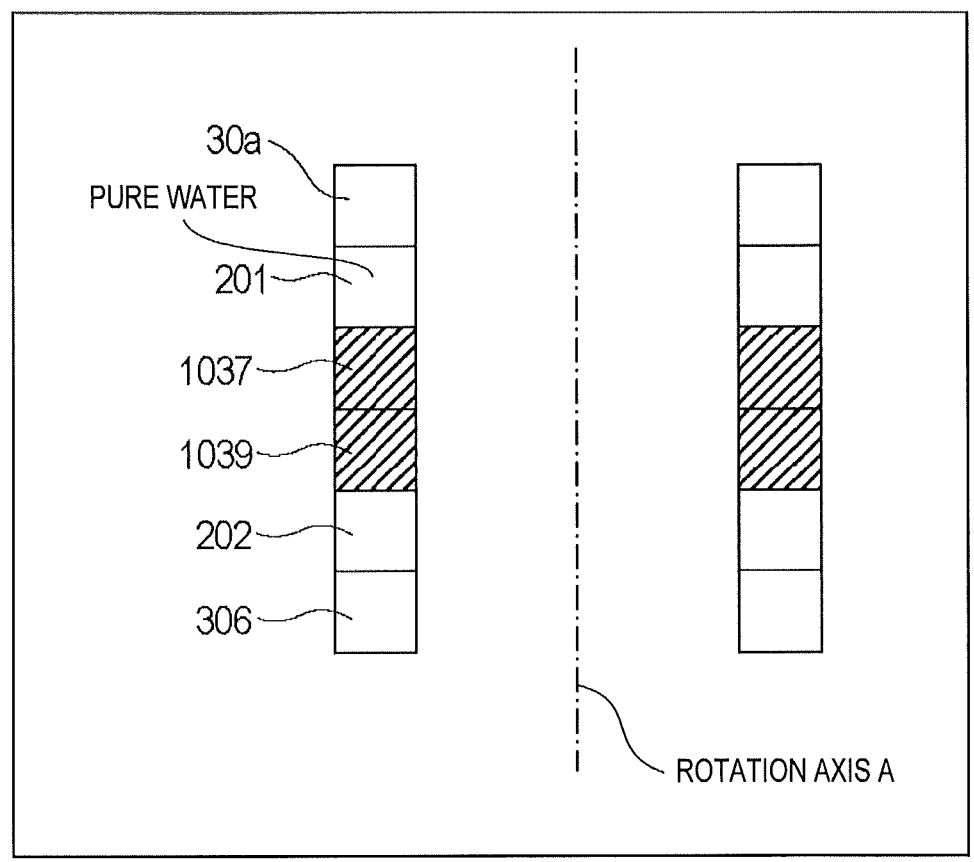
FIG. 5 is a schematic view showing the current path of a power supply device shown in FIG. 3B.

Strictly speaking, the electrical connection between the divided regions 30a and 30b forms an electrical circuit shown in FIG. 5. More specifically, this circuit is a series circuit via the pure water present in the space 201 and the annular members 1037 and 1039 and the pure water present in the space 202. The pure water in the space 201, the pure water in the space 202, and the annular members 1037 and 1039 have a very high resistance as compared with those of the conductive members. This contributes to maintaining the dielectric resistance between the divided regions 30a and 30b to a predetermined value or more. However, when different voltages are supplied to the divided regions 30a and 30b, respectively, a small amount of current flows via the electrical circuit shown in FIG. 5. This small amount of current does not immediately interfere with a bipolar voltage supplied necessary for electrostatic attraction. As is generally known, when a current flows between conductive members through water, ions are deposited from conductive members by electrolytic corrosion. This deposit is attached to walls of the spaces 201 and 202 to result in a decrease in flow rate upon clogging. The electrical connection between the divided regions 30a and 30b may occur through a conductive material attached to the walls.

However, according to the structure of this specification, a current generated between the divided regions 30a and 30b can be minimized. This makes it possible to minimize the conductive material deposition by electrolytic corrosion, thereby greatly prolonging the maintenance time interval. The power supply device of this specification is more suitable if it meets the following conditions. More specifically, pure water managed to have a predetermined resistivity or more (1 MΩ·cm or more) is used as a coolant. Members having a resistivity of 1 MΩ·cm or more are used as the annular members 1037 and 1039 which partition the spaces 201 and 202. In addition, the divided regions 30a and 30b will not electrically contact each other.

A supply line of a coolant (cooling water) to the substrate holding portion 7a and a drain line of the coolant (cooling water) returning from the substrate holding portion 7a are partitioned by surface sliding portions slidable contact with the annular members 1039 and 1037. Even if the coolant leaks from the coolant supply line side to the coolant drain line side through the surface sliding portions, the coolant (cooling water) stays in the circulation channel whose resistance is managed to be a predetermined value or more by an ion exchange resin incorporated in a coolant supply mechanism (not shown). For this reason, the resistance of the electrical circuit shown in FIG. 5 can be properly maintained without abruptly dropping the resistivity of the coolant (cooling water).

Second Embodiment

Figure 6A:
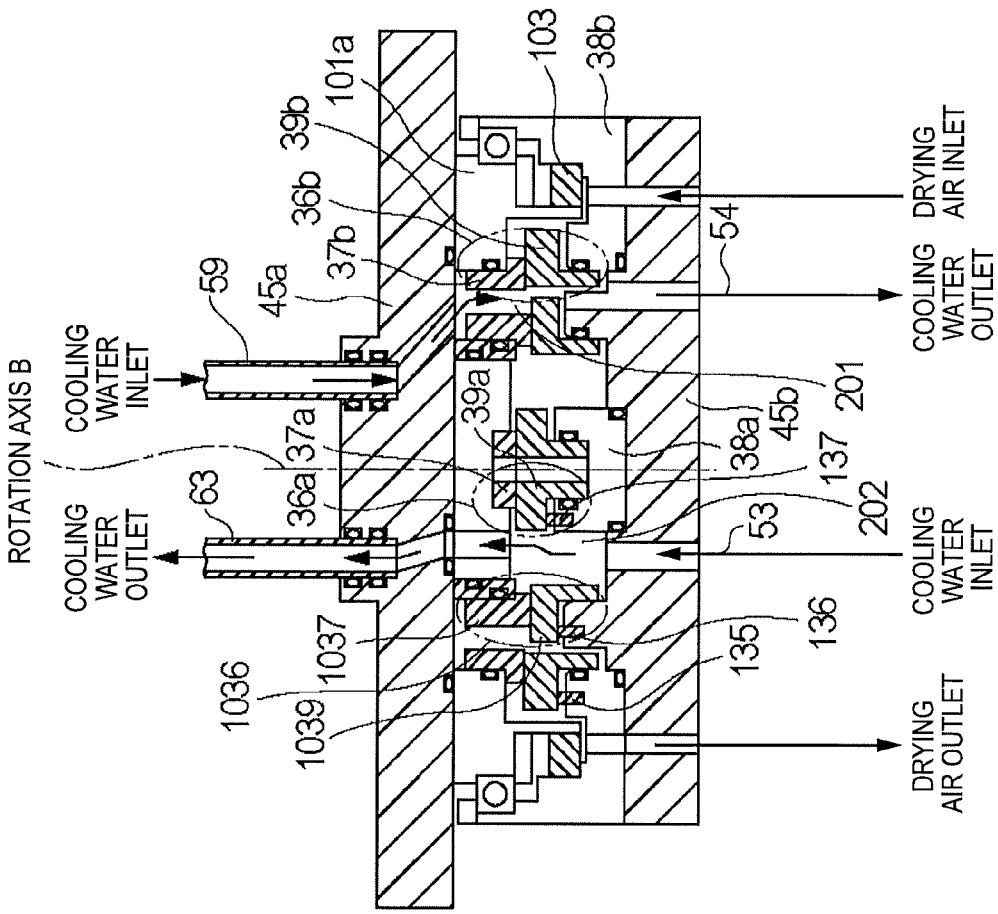
FIG. 6A is a view for explaining a fluid channel for circulating a coolant of a power supply device and a power supply path according to the second embodiment of the present invention.
Figure 6B:
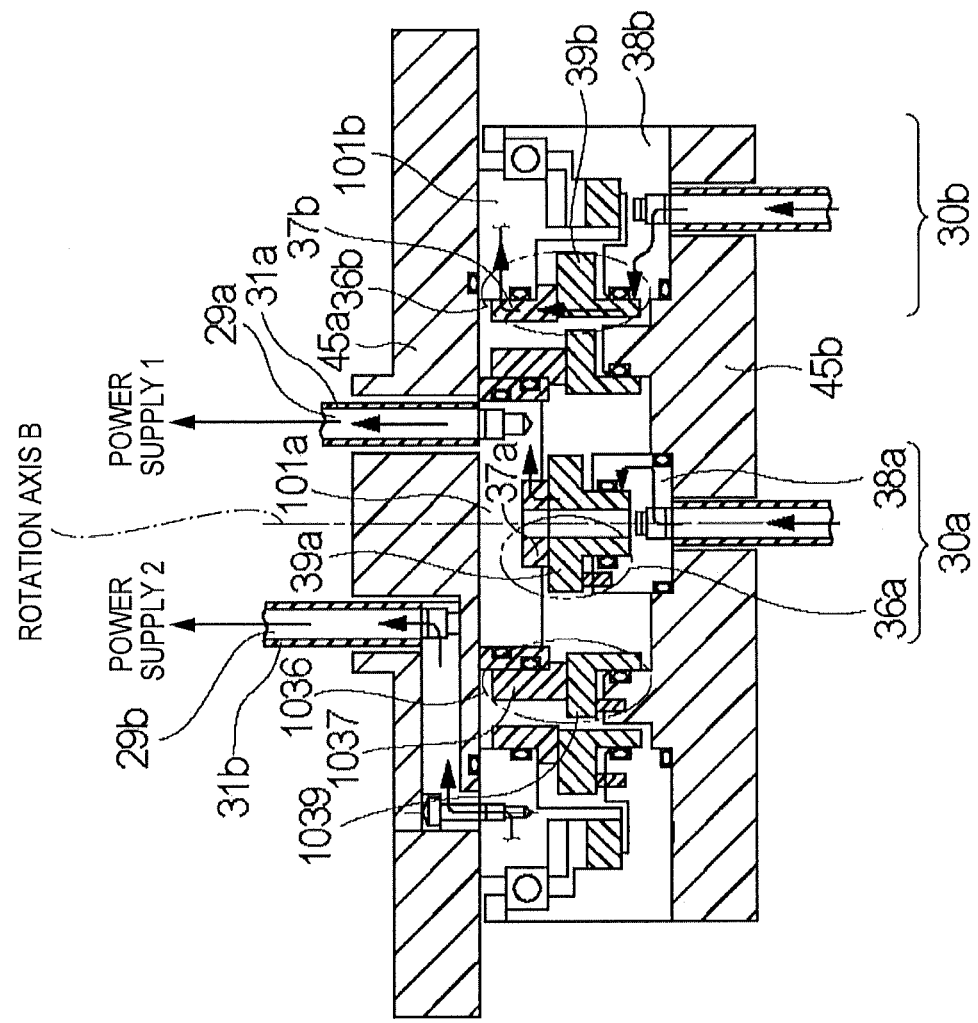
FIG. 6B is a view for explaining a fluid channel for circulating the coolant of the power supply device and the power supply path according to the second embodiment of the present invention.
Figure 7A:
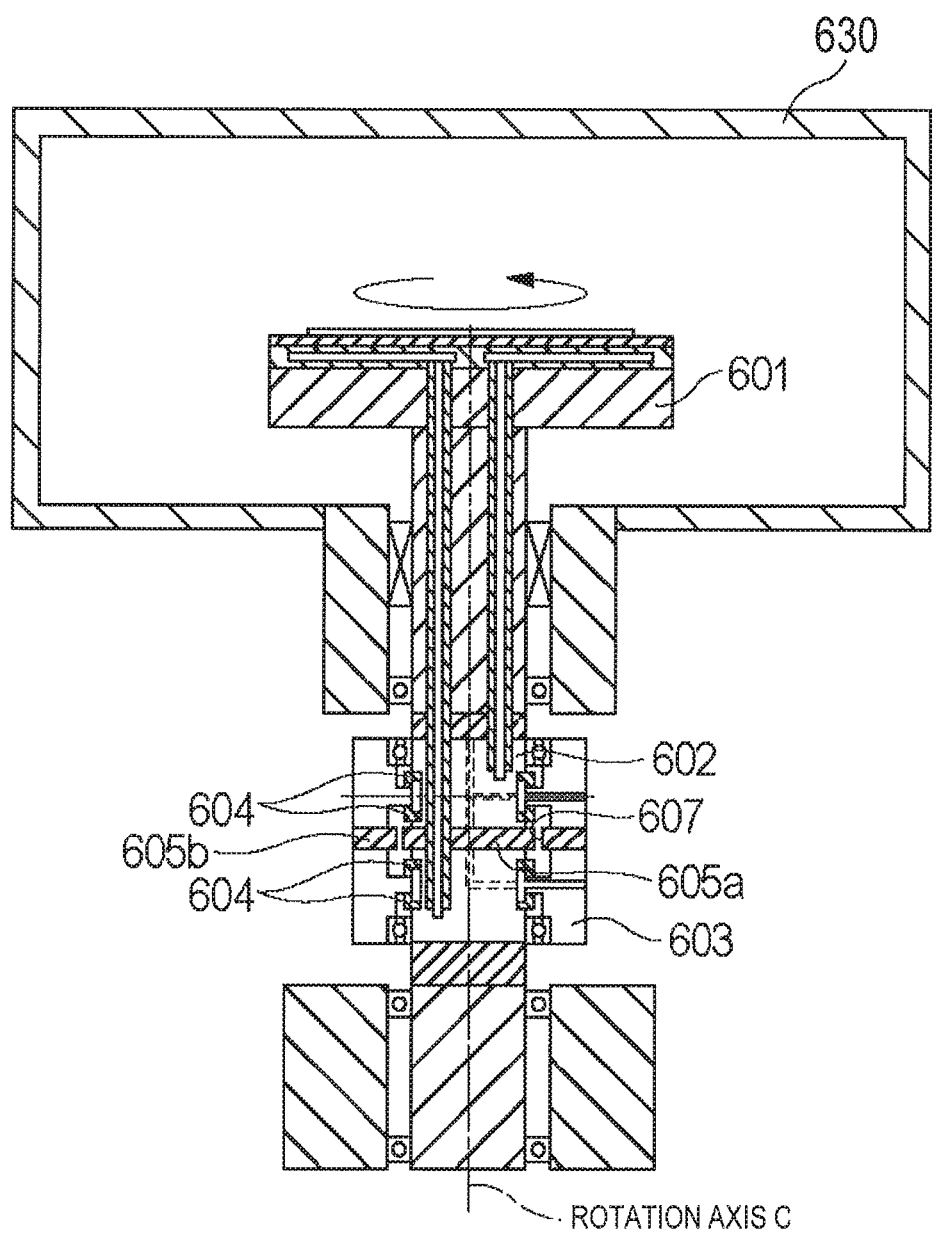
FIG. 7A is a view for explaining a conventional power supply device.

In the first embodiment described above, the power supply mechanism (power supply device) in which the plurality of conductive annular members 37a, 39a, 37b, and 39b are aligned in the rotation axis direction of the substrate has been described. According to the second embodiment, a power supply device in which a plurality of conductive annular members 37a, 39a, 37b, and 39b are parallelly arranged in a radial direction of the rotation axis of the substrate, in other words, in a concentric manner using the rotation axis of the substrate as the center, as shown in FIGS. 6A and 6B will be described below. When the plurality of conductive annular members 37a, 39a, 37b, and 39b are parallelly arranged in concentric manner with respect to the rotation axis of the substrate, the overall length of the power supply device can be shorter than the conventional power supply device having a plurality of polarities. The unit can be made compact. Note that the conductive annular members of the second embodiment have dimensions and shapes different from those of the conductive annular members 37a, 39a, 37b, and 39b in the first embodiment, but the same reference numerals as in the first embodiment denote the same functions in the second embodiment.

FIG. 6A is a view for explaining a fluid channel for circulating the coolant of the power supply device according to the second embodiment of the present invention. FIG. 6B is a view showing the power supply mechanism of the power supply device according to the second embodiment of the present invention. The power supply device of this embodiment has a structure in which a plurality of conductive annular members are parallelly arranged in a concentric manner with respect to the rotation axis of the substrate. A housing is formed to face an end portion (that is, an end portion opposite to the substrate holder side) of a rotation column (column). The channels and power supply rods extend through the wall surface of the housing opposing to the end portion of the rotation column so that the coolant and the power supply pipe are accessible in the rotation axis direction of the column. For the respective members constituting the power supply device according to the second embodiment, members having the same functions as in the first embodiment denote the same reference numerals, and a detailed description thereof will not be repeated.

In the power supply device according to each of the first and second embodiments, a pair of annular members 1037 and 1039 are provided as the separation means. However, a plurality of pairs of annular members 1037 and 1039 may be provided. In place of the annular members 1037 and 1039, two pairs of conductive annular members 37a and 39a of the rotary joints 36a may be provided to flow the coolant between them. In this case, one pair of the conductive annular members 37a and 39a functions as the separation means. Similarly, two pairs of conductive annular members 37b and 39b of rotary joints 36b may be provided.

In the power supply device according to each of the first and second embodiments, the annular members 1037 and 1039 are mounted in an insulating rotation column 45a and a housing 45b. However, the annular members 1037 and 1039 may simply be mounted in rotation columns 101a and 101b and housings 38a and 38b. An insulating coating is formed on part of the conductive member which contacts the coolant, thereby obtaining the effect of the present invention. For example, when the annular member 1037 and 1039 are arranged to contact the first and second voltages in a space 201, insulating coatings are formed on the conductive members applied with voltages different from the voltage supplied to the rotation column 25 side contacting the space 201.

In the power supply device according to each of the first and second embodiments, the coolant is supplied to a substrate stage 7 through the rotation columns 101a and 101b. The power supply device of the present invention is applicable to a processing apparatus which does not cool a substrate. In this case, the coolant supplied from the cooling water inlet port is drained from the cooling water outlet through the rotation column 45a. A channel for connecting the space 201 and a space 202 is formed in the first insulating member 45a. Alternatively, the cooling water inlet and outlet may be formed in each of the housings 38a and 38b, and the coolant components may be merged outside. In this case, a channel hole for cooling water need not be formed in the first insulating member 45a.

The power supply device according to each of the first and second embodiments is mounted in only the rotation column 25 of the ion beam etching apparatus 1, but may be mounted in the rotation cylinder 32, as a matter of course. In this case, cables 33a and 33b will not twist. For example, the power supply device is applied to a processing apparatus which applies RF bias power. This can eliminate twisting of the cables 33a and 33b depending on the angle of the substrate holder, thereby further stabilizing the effect of applying the bias power.

The power supply device according to each of the first and second embodiments includes one rotary joint 36a (first conductive portion), one rotary joint 36b (second conductive portion), and one rotary joint 1036 (insulating seal portion). However, the power supply device may include a plurality of rotary joints 36a, a plurality of rotary joints 36b, and a plurality of rotary joints 1036. In this case, the rotary joint 36a (first conductive portion) and the rotary joint 1036 (insulating seal portion) are paired and stacked to form a rotation column. For example, when four-pole potentials are supplied to the substrate holder, the rotary joint 1036 is inserted between adjacent ones of the four rotary joints 36a to form part of the rotation column 25.

The power supply device according to each of the first and second embodiments is applicable to the substrate processing apparatus in which the substrate holder is turned in a state in which the normal to the substrate holding surface of the substrate holder is perpendicular to the gravity direction, thereby processing the substrate. Power can be stably supplied to the substrate holder having a plurality of electrodes.

The present invention is not limited to the above-described embodiments, and various changes and modifications can be made within the spirit and scope of the present invention. Therefore, to apprise the public of the scope of the present invention, the following claims are made.

REFERENCE SIGNS LIST

1: ion beam etching apparatus, 3: vacuum vessel, 5: ion beam source, 7: substrate stage, 7a: substrate holding portion (substrate holder), 7b: rotation support portion, 9: shutter device, 23: dielectric plate, 24: electrostatic chuck, 25, 45a, 101a, 101b: rotation column, 26: vacuum seal mechanism, 27: rotation driving device, 28a, 28b: electrode, 29a, 29b: power supply rod, 30: power supply mechanism, 30a, 30b: divided region, 31a, 31b: insulating member, 32: rotation cylinder, 33a, 33b: cable, 38a, 38b, 45b: housing, 36, 36a, 36b, 1036: rotary joint, 37a, 39a, 37b, 39b: conductive annular member, 59: cooling water drain pipe, 63: cooling water supply pipe, 64: insulating member, 71a: first voltage power supply, 71b: second voltage power supply, 102, 104: O-ring, 103: rubber seal member, 1037, 1039: annular member, 130: annular portion, 135, 137: elastic member, 138: annular portion (seal portion), 139: annular portion, 201, 202: space, 300, 310: drying air inlet port, 320, 330: drying air outlet

The invention claimed is:

1. A power supply device comprising:
a substrate holder capable of holding a substrate and having a cooling channel;
a column connected to the substrate holder and including a first conductive column portion, second conductive column portion, and a first insulating member having an outer cylindrical surface and arranged between the first conductive column portion and the second conductive column portion so as to connect the first conductive column portion and the second conductive column portion, the outer cylindrical surface having a first opening and a second opening which communicate with the cooling channel;
a housing rotatably supporting the column and including a first conductive housing portion, a second conductive housing portion, and a second insulating member having an inner cylindrical surface facing the outer cylindrical surface and arranged between the first conductive housing portion and the second conductive housing portion so as to connect the first conductive housing portion and the second conductive housing portion;
a first conductive rotary joint configured to supply a first voltage from the first conductive housing portion to the first conductive column portion;
a second conductive rotary joint configured to supply a second voltage from the second conductive housing portion to the second conductive column portion, the second conductive rotary joint being insulated from the first conductive rotary joint;
a first power supply member electrically connected to the first conductive column portion and configured to supply the first voltage to the substrate holder;
a second power supply member electrically connected to the second conductive column portion and configured to supply the second voltage to the substrate holder; and
an insulating seal portion including a first annular member fixed around the outer cylindrical surface of the first insulating member, and a second annular member fixed inside the inner cylindrical surface of the second insulating member, the first annular member being in slidable contact with the second annular member,
wherein a first space capable of flowing a coolant is defined by at least the first conductive rotary joint, the insulating seal portion, the outer cylindrical surface of the first insulating member and the inner cylindrical surface of the second insulating member such that the first opening faces the first space so as to communicate the first space with the cooling channel, and
wherein a second space capable of flowing the coolant is defined by at least the second conductive rotary joint, the insulating seal portion, the outer cylindrical surface of the first insulating member and the inner cylindrical surface of the second insulating member such that the second opening faces the second space so as to communicate the second space with the cooling channel.

2. The power supply device according to claim 1, wherein the coolant supplied to one of the first space and the second space flows through the substrate holder and is drained from the other of the first space and the second space.

3. The power supply device according to claim 1, wherein the column comprises a first channel configured to supply the coolant to the substrate holder and a second channel configured to drain the coolant from the substrate holder,
the first channel being connected to one of the first space and the second space, and the second channel being connected to the other of the first space and the second space.

4. The power supply device according to claim 1, wherein the first conductive column portion, the second conductive portion, and the insulating seal portion are arranged along a rotation axis direction of the column.

5. The power supply device according to claim 1, wherein the first conductive portion, the second conductive portion, and the insulating seal portion are spaced apart from each other in a radial direction of the column.

6. The power supply device according to claim 1, wherein the first conductive rotary joint comprises a first rotation conductive member connected to the first conductive column portion and a first fixed conductive member connected to the first conductive housing portion and in slidable contact with the first rotation conductive member, and
the second conductive rotary joint comprises a second rotation conductive member connected to the second conductive column portion and a second fixed conductive member connected to the second conductive housing portion and in slidable contact with the second rotation conductive member.

7. The power supply device according to claim 1, wherein a third space is arranged opposite to the first space via the first conductive rotary joint, and a channel configured to supply a gas to an interior of the third space through the first conductive portion is formed.

8. The power supply device according to claim 7, wherein a channel configured to collect a gas supplied to the interior of the third space through the first conductive portion is formed.

9. The power supply device according to claim 1, wherein a fourth space is arranged opposite to the second space via the second conductive rotary joint, and a channel configured to supply a gas to an interior of the fourth space through the second conductive portion is formed.

10. The power supply device according to claim 9, wherein a channel configured to collect a gas supplied to the interior of the fourth space through the second conductive portion is formed.

11. The power supply device according to claim 1, further comprising:
   a first rotation driving device configured to rotate the housing about a first rotation axis; and
   a second rotation driving device configured to rotate the substrate holder about a second rotation axis in a direction perpendicular to the first rotation axis.

12. A vacuum processing apparatus in which the substrate holder is arranged in a vacuum processing chamber and includes an electrostatic attraction device configured to hold a substrate subjected to a predetermined vacuum process, wherein power is supplied to the electrostatic attraction device through a power supply device defined in claim 1.

* * * * *